(12) United States Patent
Baldwin et al.

(10) Patent No.: US 6,969,753 B2
(45) Date of Patent: *Nov. 29, 2005

(54) SPIN-ON-GLASS ANTI-REFLECTIVE COATINGS FOR PHOTOLITHOGRAPHY

(75) Inventors: Teresa Baldwin, Fremont, CA (US); Joseph Kennedy, San Jose, CA (US); Nigel Hacker, Palo Alto, CA (US); Richard Spear, Portland, OR (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/300,357

(22) Filed: Nov. 19, 2002

(65) Prior Publication Data

US 2003/0120018 A1 Jun. 26, 2003

Related U.S. Application Data

(60) Division of application No. 09/491,166, filed on Jan. 26, 2000, now Pat. No. 6,506,497, which is a continuation-in-part of application No. 09/330,248, filed on Jun. 10, 1999, now Pat. No. 6,268,457.

(51) Int. Cl.$^7$ ............................................. C08G 77/12
(52) U.S. Cl. ...................... 528/31; 528/34; 528/28; 528/26; 528/29; 428/447; 106/287.11
(58) Field of Search ..................... 528/31, 34, 28, 528/26, 29; 428/447; 106/287.11

(56) References Cited

U.S. PATENT DOCUMENTS

| | | | |
|---|---|---|---|
| 3,615,272 A | 10/1971 | Collins | 23/366 |
| 3,873,361 A | 3/1975 | Franco et al. | 117/212 |
| 3,884,702 A | 5/1975 | Koshimo et al. | 96/115 |
| 4,053,313 A | 10/1977 | Fan | 96/36 |
| 4,257,826 A | 3/1981 | Matalone, Jr. | 148/1.5 |
| 4,290,896 A | 9/1981 | Gordon et al. | 210/710 |
| 4,312,970 A | 1/1982 | Gaul, Jr. | 526/279 |
| 4,328,262 A | 5/1982 | Kurahashi et al. | 427/93 |
| 4,349,609 A | 9/1982 | Takeda et al. | 428/429 |
| 4,399,266 A | 8/1983 | Matsumura et al. | 528/10 |
| 4,413,052 A | 11/1983 | Green et al. | 430/327 |
| 4,419,437 A | 12/1983 | Noonan et al. | 430/270 |
| 4,423,135 A | 12/1983 | Chen et al. | 430/271 |
| 4,434,127 A | 2/1984 | Baile et al. | 264/236 |
| 4,483,107 A | 11/1984 | Tomoyori et al. | 51/281 |
| 4,510,283 A | 4/1985 | Takeda et al. | 524/356 |
| 4,513,132 A | 4/1985 | Shoji et al. | 528/21 |
| 4,515,828 A | 5/1985 | Economy et al. | 427/82 |
| 4,600,685 A | 7/1986 | Kitakohji et al. | 430/313 |
| 4,603,168 A | 7/1986 | Sasaki et al. | 522/18 |
| 4,617,252 A | 10/1986 | Cordes, III et al. | 430/272 |
| 4,626,556 A | 12/1986 | Nozue et al. | 522/99 |
| 4,657,843 A | 4/1987 | Fukuyama et al. | 430/323 |
| 4,657,965 A | 4/1987 | Watanabe et al. | 524/506 |
| 4,663,414 A | 5/1987 | Estes et al. | 528/30 |
| 4,670,299 A | 6/1987 | Fukuyama et al. | 427/96 |
| 4,676,867 A | 6/1987 | Elkins et al. | 156/643 |
| 4,687,216 A | 8/1987 | Kawamoto et al. | 280/91 |
| 4,702,990 A | 10/1987 | Tanaka et al. | 430/197 |
| 4,723,978 A | 2/1988 | Clodgo et al. | 65/31 |
| 4,745,169 A | 5/1988 | Sugiyama et al. | 528/43 |
| 4,753,855 A | 6/1988 | Haluska et al. | 428/702 |
| 4,756,977 A | 7/1988 | Haluska et al. | 428/704 |
| 4,806,504 A | 2/1989 | Cleeves | 437/228 |
| 4,808,653 A | 2/1989 | Haluska et al. | 524/398 |
| 4,822,697 A | 4/1989 | Haluska et al. | 428/698 |
| 4,826,943 A | 5/1989 | Ito et al. | 528/21 |
| 4,847,162 A | 7/1989 | Haluska et al. | 428/457 |
| 4,849,296 A | 7/1989 | Haluska et al. | 428/457 |
| 4,855,199 A | 8/1989 | Bolon et al. | 430/18 |
| 4,863,833 A | 9/1989 | Fukuyama et al. | 430/286 |
| 4,895,914 A | 1/1990 | Saitoh et al. | 525/478 |
| 4,898,907 A | 2/1990 | Haluska et al. | 524/490 |
| 4,904,721 A | 2/1990 | Hanaoka et al. | 524/266 |
| 4,910,122 A | 3/1990 | Arnold et al. | 430/313 |
| 4,911,992 A | 3/1990 | Haluska et al. | 429/698 |
| 4,921,778 A | 5/1990 | Thackeray et al. | 430/326 |
| 4,935,320 A | 6/1990 | Rohde et al. | 430/14 |
| 4,973,526 A | 11/1990 | Haluska | 428/697 |
| 4,981,530 A | 1/1991 | Clodgo et al. | 148/33.3 |
| 4,988,514 A | 1/1991 | Fukuyama et al. | 524/755 |
| 4,999,397 A | 3/1991 | Weiss et al. | 524/755 |
| 5,008,320 A | 4/1991 | Haluska et al. | 524/361 |
| 5,043,789 A | 8/1991 | Linde et al. | 357/52 |
| 5,045,592 A | 9/1991 | Weiss et al. | 524/755 |
| 5,059,448 A | 10/1991 | Chandra et al. | 427/53.1 |
| 5,063,134 A | 11/1991 | Horiguchi et al. | 430/192 |
| 5,063,267 A | 11/1991 | Hanneman et al. | 524/284 |

(Continued)

FOREIGN PATENT DOCUMENTS

| | | |
|---|---|---|
| JP | 406056560 A | 3/1994 |
| JP | 2001-92122 | 4/2001 |

OTHER PUBLICATIONS

Honeywell, "Material Safety Data Sheet, Accuglass T–08 (108, 208) Spin–On Glass", Jun. 19, 2002, pp. 1–8.

Honeywell, "Material Safety Data Sheet, Accuglass T–04 Spin–On Glass", Jun. 30, 1998, pp. 1–7.

Honeywell, "Material Safety Data Sheet, Accuspin 720 Spin–On Polymer", Mar. 7, 2000, pp. 1–7.

(Continued)

*Primary Examiner*—Margaret G. Moore
(74) *Attorney, Agent, or Firm*—Bingham McCutchen; Sandra P. Thompson

(57) ABSTRACT

Anti-reflective coating materials for deep ultraviolet photolithography include one or more organic light-absorbing compounds incorporated into spin-on-glass materials. Suitable absorbing compounds are strongly absorbing over wavelength ranges around wavelengths such as 365 nm, 248 nm, and 193 nm that may be used in photolithography. A method of making absorbing spin-on-glass materials includes combining one or more organic absorbing compounds with alkoxysilane or halosilane reactants during synthesis of the spin-on-glass materials.

15 Claims, 3 Drawing Sheets

U.S. PATENT DOCUMENTS

| | | | | |
|---|---|---|---|---|
| 4,546,017 | A | | 8/1996 | Vitunic .......................... 326/30 |
| 6,096,460 | A | * | 8/2000 | French et al. ................... 430/5 |
| 6,165,697 | A | | 12/2000 | Thacharay et al. .......... 430/325 |
| 6,174,631 | B1 | | 1/2001 | French et al. ................... 430/5 |
| 6,268,108 | B1 | | 7/2001 | Iguchi et al. ............ 430/271.1 |
| 6,268,457 | B1 | * | 7/2001 | Kennedy et al. ............ 428/447 |
| 6,329,118 | B1 | * | 12/2001 | Hussein et al. .......... 430/270.1 |
| 6,365,765 | B1 | | 4/2002 | Baldwin et al. ............ 556/440 |
| 6,506,497 | B1 | * | 1/2003 | Kennedy et al. ............ 428/447 |
| 6,515,073 | B2 | | 2/2003 | Sakamoto et al. .......... 525/100 |

OTHER PUBLICATIONS

Pacansky, et al. entitled "Photochemical Decomposition Mechanisms for AZ–Type Photoresists", Jan. 1979, pp. 42–55.

Korchkov, et al. entitled "Low Temperature Dielectric Films From Octavinylsilsesquioxane", Dec. 1982, pp. 373–376.

Lavrent'yev, et al. entitled "Polyhedral Oligosilsesquioxanes and Their Homo Derivatives", Aug. 1981, pp. 199–236.

Lavrent'yev, et al. entitled "Ethylmethyloctasesquioxanes: Products of the Reactions of Ethylpolycyclosiloxanes with Trichalormethylsilane. Their Chromatographic Mass Spectrometric Investigation," 1981.

Li, et al. entitled "Organosiloxane Based Bottom Antireflective Coatings for 193nm Lithography", pp. 1–10.

Li, et al. entitled "An Organosiloxane Spin On Bottom Antireflective Coatings for ArF Lithography", pp. 1–9.

* cited by examiner anthraflavic acid
1

9-anthracene carboxylic acid
2

9-anthracene methanol
3 alizarin
4 quinizarin
5 primuline
6

2-hydroxy-4(3-triethoxysilylpropoxy)-
diphenylketone
7 rosolic acid
8 triethoxysilylpropyl-1,8-naphthalimide
9

9-anthracene carboxy-methyl triethoxysilane
10 phenyltriethoxysilane
11

4-phenylazophenol
12

SPIN-ON-GLASS ANTI-REFLECTIVE COATINGS FOR PHOTOLITHOGRAPHY

CROSS REFERENCE TO RELATED APPLICATION

This application is a divisional of allowed application Ser. No. 09/491,166, filed Jan. 26, 2000 now U.S. Pat. No. 6,506,497 and is a continuation-in-part of U.S. utility application Ser. No.: 09/330,248 filed Jun. 10, 1999 now U.S. Pat. No. 6,268,457 issued on Jul. 31, 2001.

TECHNICAL FIELD

The present invention relates generally to spin-on glass materials and more specifically to light-absorbing spin-on glass materials for use as anti-reflective layers in photolithography and methods of producing the materials.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

It has long been recognized that linewidth variations in patterns produced by photolithography can result from optical interference from light reflecting off an underlying layer on a semiconductor wafer. Variations in photoresist thickness due to the topography of the underlying layer also induce linewidth variations. Anti-reflective coatings (ARC) applied under a photoresist layer have been used to prevent interference from reflection of the irradiating beam. In addition, anti-reflective coatings partially planarize the wafer topography, helping to improve linewidth variation over steps because the photoresist thickness is more uniform.

Organic polymer films, particularly those that absorb at the i-line (365 nm) and g-line (436 nm) wavelengths conventionally used to expose photoresists, and at the recently used 248 nm wavelength, have been employed as anti-reflective coatings. However, the fact that the organic ARC's share many chemical properties with the organic photoresists can limit usable process sequences. Furthermore organic ARC's may intermix with photoresist layers. One solution to avoid intermixing, is to introduce thermosetting binders as additional components of organic ARC's, as described, for example in U.S. Pat. No. 5,693,691 to Flaim et al. Dyes may also be incorporated in organic ARC's, as well as, optionally, additional additives such as wetting agents, adhesions promoters, preservatives, and plasticizers, as described in U.S. Pat. No. 4,910,122 to Arnold et al.

Silicon oxynitride is another material that has been used as an anti-reflective coating. However, silicon oxynitride works as an ARC by a destructive interference process rather than by absorption, which means that very tight control of the oxynitride thickness is necessary and that the material may not work well as an ARC over highly variable topography. Furthermore silicon oxynitride is typically deposited by chemical vapor deposition, while photoresist layers are typically applied using a spin-coater. The additional chemical vapor deposition process can add to processing complexity.

Yet another class of materials that can be used as an anti-reflective layer is spin-on-glass (SOG) compositions containing a dye. Yau et al., U.S. Pat. No. 4,587,138, disclose a dye such as basic yellow #11 mixed with a spin-on-glass in an amount approximately 1% by weight. Allman et al. U.S. Pat. No. 5,100,503 disclose a cross-linked polyorganosiloxane containing an inorganic dye such as $TiO_2$, $Cr_2O_7$, $MoO_4$, $MnO_4$, or $ScO_4$, and an adhesion promoter. Allman additionally teaches that the spin-on-glass compositions also serve as a planarizing layer. However, the spin-on-glass, dye combinations that have been disclosed to date are not optimal for exposure to the deep ultraviolet, particularly 248 and 193 nm, light sources that are coming into use to produce devices with small feature sizes. Furthermore, not all dyes can be readily incorporated into an arbitrary spin-on-glass composition.

What is needed is an absorbing spin-on-glass anti-reflective coating material that absorbs strongly and uniformly in the deep ultraviolet spectral region. It would be desirable for the ARC layer to be impervious to photoresist developers. It would also be desirable to provide a method to incorporate a range of absorbing compounds into a variety of SOG materials while retaining the desirable properties of the original spin-on-glass materials.

SUMMARY

An anti-reflective coating material for deep ultraviolet photolithography includes one or more organic absorbing compounds incorporated into a spin-on-glass (SOG) material. The spin-on-glass materials include methylsiloxane, methylsilsesquioxane, phenylsiloxane, phenylsilsesquioxane, methylphenylsiloxane, methylphenylsilsesquioxane, and silicate polymers. As used herein, spin-on-glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and alkoxyhydridosiloxane or hydroxyhydridosiloxane. Spin-on-glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl. Coating solutions of spin-on-glass materials incorporating absorbing comounds are used to form anti-reflecting films on various layers in integrated circuit devices.

Absorbing compounds suitable for use with the present invention are strongly absorbing at wavelengths less than about 375 nm or less than about 260 nm. In particular, suitable absorbing compounds are strongly absorbing over at least an approximately 10 nm wide wavelength range around wavelengths such as 248 nm, 193 nm, or other ultraviolet wavelengths, such as 365 nm, that may be used in photolithography. The chromophores of suitable compounds typically have from one to three benzene rings that may or may not be fused. Incorporatable absorbing comounds have an accessible reactive group attached to the chromophore, the reactive groups including hydroxyl groups, amine groups, carboxylic acid groups, and substituted silyl groups with silicon bonded to one, two, or three alkoxy group or halogen atom substituents. The reactive groups may be directly bonded to the chromophore or the reactive groups may be attached to the chromophore through a hydrocarbon bridge.

Examples of suitable organic absorbing compounds include anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-methyl triethoxysilane, phenyltriethoxysilane, azo compounds, such as 4-phenylazophenol, and mixtures thereof.

According to another aspect of the present invention, methods for synthesizing absorbing spin-on-glass compositions are provided. Spin-on-glass materials are conventionally synthesized from silane reactants such as triethoxysilane, tetraethoxysilane, methyltriethoxysilane, dimethyldiethoxysilane, tetramethoxysilane, methyltrimethoxysilane, trimethoxysilane, dimethyldimethoxysilane, phenyltriethoxysilane, phenyltrimethoxysilane, diphenyldiethoxysilane, and diphenyldimethoxysilane. Halosilanes, particularly chlorosilanes, for example, trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants.

A method of making an absorbing spin-on-glass composition includes combining one or more alkoxysilanes, or, one or more halosilanes, one or more incorporatable organic absorbing compounds, an acid/water mixture, such as a nitric acid/water mixture, and one or more solvents to form a reaction mixture; and refluxing the reaction mixture to form the absorbing spin-on-glass composition. The spin-on-glass composition so formed is diluted with one or more solvents to provide coating solutions that produce films of various thicknesses. Alternative methods of making an absorbing spin-on-glass composition, including methods using halosilanes and a phase transfer catalyst, are also provided.

According to yet another aspect of the invention, the absorbing compound of the chemical composition 9-anthracene carboxy-methyl triethoxysilane is provided. A method of synthesizing 9-anthracene carboxy-methyl triethoxysilane includes combining 9-anthracene carboxylic acid, chloromethyltriethoxysilane, triethylamine, and a solvent to form a reaction mixture; refluxing the reaction mixture; cooling the refluxed reaction mixture to form a precipitate and a remaining solution; and filtering the remaining solution to produce liquid 9-anthracene carboxymethyl triethoxysilane.

DETAILED DESCRIPTION

Figure 1A:
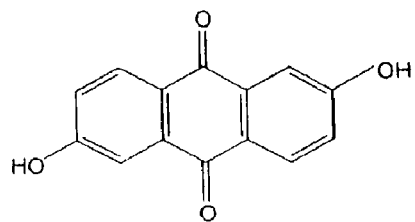
FIGS. 1a and 1b illustrate the chemical formulas of absorbing compounds incorporated into spin-on-glass compositions, according to embodiments of the present invention.
Figure 1A:
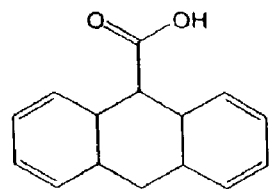
Figure 1A:
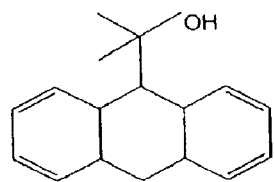
Figure 1A:
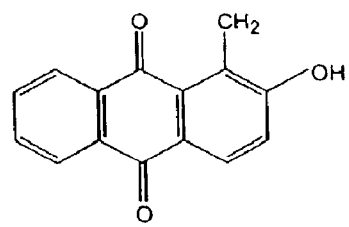
Figure 1A:
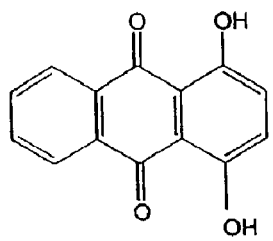
Figure 1A:
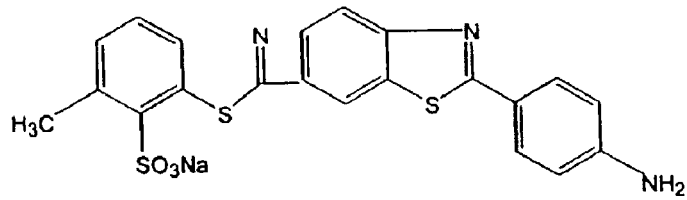

An anti-reflective coating material for deep ultraviolet photolithography includes one or more organic absorbing compounds incorporated into a spin-on-glass (SOG) material. The absorbing spin-on-glass compositions are dissolved in appropriate solvents to form coating solutions and applied to various layers of materials in fabricating semiconductor devices. The absorbing spin-on-glass anti-reflective coatings have been designed to be readily integrated into existing semiconductor fabrication processes. Properties that provide integration include developer resistance, thermal stability during standard photoresist processing, and selective removal with respect to underlying layers.

The spin-on-glass materials used in compositions according to aspects of the present invention, include methylsiloxane, methylsilsesquioxane, phenylsiloxane, phenylsilsesquioxane, methylphenylsiloxane, methylphenylsilsesquioxane, and silicate polymers. As used herein, spin-on-glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and an alkoxyhydridosiloxane or hydroxyhydridosiloxane. Spin-on-glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl. Some useful organohydridosiloxane polymers have the sum of n and m from about 8 to about 5000 where R is a $C_1$–$C_{20}$ alkyl group or a $C_6$–$C_{12}$ aryl group. The organohydridosiloxane and organohydridosilsesquioxane polymers are alternatively denoted spin-on-polymers. Specific examples include methylhydridosiloxanes, ethylhydridosiloxanes, propylhydridosiloxanes, t-butylhydridosiloxanes, phenylhydridosiloxanes, methylhydridosilsesquioxanes, ethylhydridosilsesquioxanes, propylhydridosilsesquioxanes, t-butylhydridosilsequioxanes, phenylhydridosilsesquioxanes, and combinations, thereof.

Many naphthalene- and anthracene-based compounds have significant absorption at 248 nm and below. Benzene-based, equivalently termed here phenyl-based, compounds have significant absorption at wavelengths shorter than 200 nm. While these napthalene-, anthracene-, and phenyl-based compounds are frequently referred to as dyes, the term absorbing compound is used here because the absorptions of these compounds are not limited to wavelengths in the visible region of the spectrum. However, not all such absorbing compounds can be incorporated into spin-on-glasses for use as ARC materials. Absorbing compounds suitable for use with the present invention have an absorption peak over at least an approximately 10 nm wide wavelength range centered around wavelengths such as 248 nm, 193 nm, or other ultraviolet wavelengths, such as 365 nm, that may be used in photolithography. Absorbing compounds which only have narrow absorption peaks, for example, less than 2 nm wide, around these wavelengths are not as desirable.

The chromophores of suitable absorbing compounds typically have one, two, or three benzene rings that may or may not be fused. Incorporatable absorbing compounds have an accessible reactive group attached to the chromophore, the reactive groups including hydroxyl groups, amine groups, carboxylic acid groups, and substituted silyl groups with silicon bonded to one, two, or three "leaving groups," such as alkoxy groups or halogen atoms. Ethoxy or methoxy groups or chlorine atoms are frequently used as leaving groups. Thus, suitable reactive groups include siliconethoxy, silicondiethoxy, silicontriethoxy, siliconmethoxy, silicondimethoxy, silicontrimethoxy, chlorosilyl, dichlorosilyl, and trichlorosilyl groups. The reactive groups may be directly bonded to the chromophore, as, for example, in phenyltriethoxysilane, or the reactive groups may be attached to the chromophore through a hydrocarbon bridge, as, for example, in 9-anthracene carboxy-methyl triethoxysilane. The inclusion of silicontriethoxy groups on chromophores, for example, has been found to be advantageous, especially for promoting stability of the absorbing SOG films. Absorbing compounds containing an azo group, —N=N—, and an accessible reactive group, particularly those containing an azo group linking benzene rings, are also useful, especially when absorption around 365 nm is desired.

In the absorbing spin-on-glass, compositions, the absorbing compounds may be incorporated interstitially in the spin-on-glass matrix. Alternatively, the absorbing compounds are chemically bonded to the spin-on-glass polymer. Without being bound to any theory, the inventors suggest that bonding of incorporatable absorbing compounds to the spin-on-glass polymer backbone via the accessible reactive groups provides beneficial results.

Figure 1B:
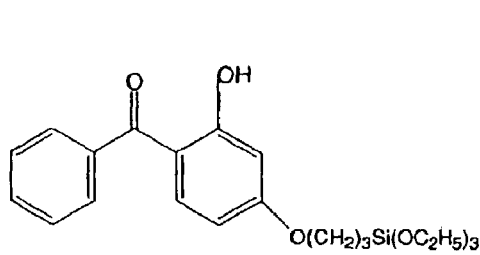
Figure 1B:
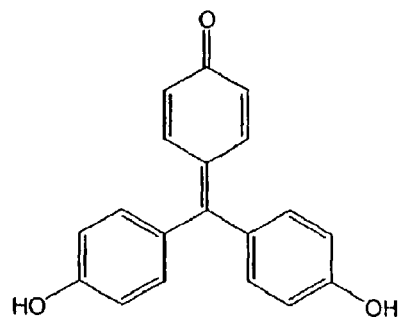
Figure 1B:
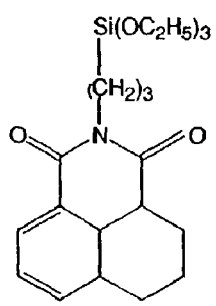
Figure 1B:
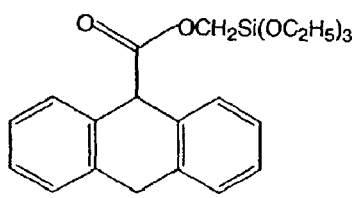
Figure 1B:
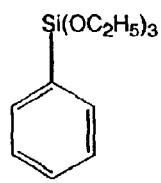
Figure 1B:
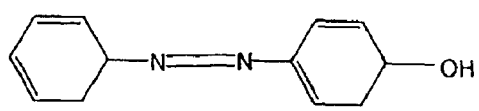

Examples of absorbing compounds suitable for use with the present invention include anthraflavic acid (1), 9-anthracene carboxylic acid (2), 9-anthracene methanol (3), alizarin (4), quinizarin (5), primuline (6), 2-hydroxy-4(3-triethoxysilylpropoxy)-diphenylketone (7), rosolic acid (8), triethoxysilylpropyl-1,8-naphthalimide (9), and 9-anthracene carboxy-methyl triethoxysilane (10), phenyltriethoxysilane (11), 4-phenylazophenol, (12), and combinations, thereof. Chemical formulas of absorbing compounds 1–12 are illustrated in FIGS. 1a–1b. Advantageous results have been obtained, for example, with 9-anthracene carboxy-methyl triethoxysilane (10) with combinations of 9-anthracene methanol (3), 2-hydroxy-4(3-triethoxysilylpropoxy)-diphenylketone (7), and rosolic acid (8), and with phenyltriethoxysilane (11).

Absorbing compounds 1–9 and 12 are available commercially, for example, from Aldrich Chemical Company (Milwaukee, Wis.). Absorbing compound 10 is synthesized using esterification methods, as described immediately below. Absorbing compound 11 is available commercially from Gelest, Inc. (Tullytown, Pa.). Examples of phenyl-based absorbing compounds in addition to absorbing compound (11), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing compounds include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane, diphenyldiethoxysilane, and diphenyldichlorosilane, to again name only a few examples, are also suitable incorporatable absorbing compounds.

A method of synthesizing 9-anthracene carboxy-methyl triethoxysilane (10) uses 9-anthracene carboxylic acid (2) and chloromethyl triethoxysilane as reactants. The reactants are combined with triethylamine and methylisobutylketone (MIBK), previously dried over 4 Å molecular sieves, to form a reaction mixture which is heated to reflux and refluxed for from approximately 6 to 10 hours. After reflux, the reaction mixture is cooled overnight leading to a large quantity of solid precipitate. The remaining solution is roto-evaporated, filtered through a silica gel column, and roto-evaporated a second time, to produce 9-anthracene carboxy-methyl triethoxysilane (10) as a dark amber oily liquid, which may be purified.

According to another aspect of the present invention, methods for synthesizing absorbing spin-on-glass compositions are provided. Spin-on-glass materials are typically synthesized from a variety of silane reactants including, for example, triethoxysilane (HTEOS), tetraethoxysilane (TEOS), methyltriethoxysilane (MTEOS), dimethyldiethoxysilane, tetramethoxysilane (TMOS), methyltrimethoxysilane (MTMOS), trimethoxysilane, dimethyldimethoxysilane, phenyltriethoxysilane (PTEOS), phenyltrimethoxysilane (PTMOS), diphenyldiethoxysilane, and diphenyldimethoxysilane. Halosilanes, particularly chlorosilanes such as trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants. To produce the absorbing spin-on-glass compositions, the absorbing compounds, such as absorbing compounds 1–12, or combinations thereof, are combined with the silane reactants during the synthesis of the SOG materials.

In a first method, a reaction mixture including silane reactants, for example HTEOS, or TEOS and MTEOS, or, TMOS and MTMOS; or, alternatively, tetrachlorosilane and methyltrichlorosilane, one or more absorbing compounds, such as absorbing compounds 1–12; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, formic acid, phosphoric acid, hydrochloric acid or acetic anhydride are alternatively used in the acid mixture. The resulting mixture is refluxed for between approximately 1 and 24 hours to produce the absorbing SOG polymer solution.

The absorbing SOG can be diluted with appropriate solvents to achieve coating solutions that produce films of various thicknesses. Suitable dilutant solvents include acetone, 2-propanol, ethanol, butanol, methanol, propylacetate, ethyl lactate, and propylene glycol propyl ether, referred to commercially as Propasol-P. Dilutant solvents with high boiling points such as ethyl lactate and propylene glycol propyl ether have been found beneficial. It is believed high boiling point solvents decrease the probability of formation of bubble film defects. In contrast, lower boiling point solvents may become entrapped below a crosslinked top layer of a film and subsequently produce voids when driven off during a baking process step. Additional solvents useful in the invention include ethylene glycol dimethyl ether, alternatively termed glyme, anisole, dibutyl ether, dipropyl ether, propylene glycol methyl ether acetate, and pentanol Optionally, surfactants, such as the product FC430, provided by 3M (Minneapolis, Minn.), or the product Megaface R08, provided by DIC (Japan), are also added to the coating solution. The coating solution is typically between about 0.5 and 20% polymer by weight. Prior to use, the coating solution is filtered by standard filtration techniques.

According to a second method of forming absorbing SOG materials, a reaction mixture including silane reactants, one or more of absorbing compounds, such as absorbing compounds 1–12, and a solvent or combination of solvents is formed in a reaction vessel. The reaction mixture is heated to reflux and refluxed for between approximately 1 and 24 hours. The silane reactants and solvents are as described in the first method above. An acid/water mixture, as described above, is added to the reaction mixture while stirring. The resulting mixture is heated to reflux and refluxed for between approximately 1 and 24 hours to produce the absorbing SOG polymer. The absorbing SOG is diluted and filtered as described above to form a coating solution.

A method of forming an absorbing organohydridosiloxane material includes forming a mixture of a dual phase solvent which includes both a non-polar solvent and a polar solvent and a phase transfer catalyst; adding one or more organotrihalosilane, hydridotrihalosilane, and one or more of absorbing compounds, such as absorbing compounds 1–12, to provide a dual phase reaction mixture; and reacting the dual phase reaction mixture for between 1 and 24 hours to produce the absorbing organohydridosiloxane polymer. The phase transfer catalyst includes but is not limited to tetrabutylammonium chloride and benzyltrimethylammonium chloride. Exemplary non-polar solvents include, but are not limited to, pentane, hexane, heptane, cyclohexane, benzene, toluene, xylene, halogenated solvents such as carbon tetrachloride and mixtures thereof. Useful polar solvents include water, alcohols, and alcohol and water mixtures. The absorbing polymer solution is diluted and filtered as described above to form a coating solution.

The absorbing SOG coating solutions are applied to various layers used in semiconductor processing, depending on the specific fabrication process, typically by conventional spin-on deposition techniques. These techniques include a dispense spin, a thickness spin, and thermal bake steps, to produce an absorbing SOG anti-reflective film. Typical processes include a thickness spin of between 1000 and 4000 rpm for about 20 seconds and two or three bake steps at temperatures between 80° C. and 300° C. for about one minute each. The absorbing SOG anti-reflective films, according to the present invention exhibit refractive indices between about 1.3 and about 2.0 and extinction coefficients greater than 0.07. As reported below in Examples 15–17, extinction coefficients greater than 0.4 have been obtained. In contrast, the extinction coefficient of dielectric materials such as silicon dioxide, silicate, and methylsiloxane, are about zero at wavelengths greater than 190 nm.

Figure 2A:
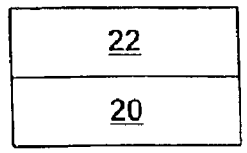
FIGS. 2a–2h illustrate the use of absorbing spin-on-glass compositions, according to embodiments of the present invention as anti-reflective coating layers in a photolithography process.
Figure 2B:
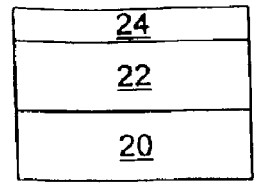
Figure 2C:
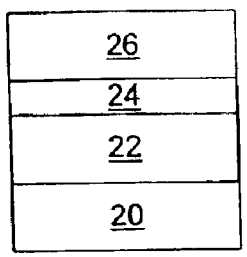
Figure 2D:
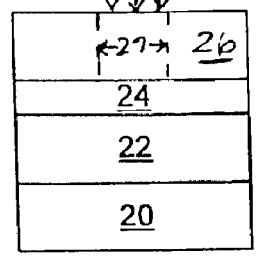

A general method of using an absorbing spin-on-glass material according to the present invention as an anti-reflective layer in a photolithographic process in fabricating an integrated circuit (IC) device is illustrated in FIGS. 2a–2h. As shown in FIG. 2a, a dielectric layer 22 is deposited on a substrate 20. Substrate 20 is a silicon substrate or substrate 20 consists of one or more metal interconnect layers in an IC device. Dielectric layer 22 can be composed of a variety of dielectric materials including, for example, a silicon dioxide layer derived from TEOS, a silane based silicon dioxide layer, a thermally grown oxide, or a chemical-vapor-deposition-produced methylhydridosiloxane or silicon dioxide incorporating other elements or compounds. Dielectric layer 22 is typically an optically transparent medium. An absorbing SOG anti-reflective coating layer 24 is applied above dielectric layer 22 (FIG. 2b) which is covered by a photoresist layer 26, of a conventional positive photoresist, to produce the stack shown in FIG. 2c. The stack of FIG. 2c is exposed to ultraviolet radiation 32 through mask 30, as shown in FIG. 2d. During the exposure, the absorbing SOG ARC layer 24 absorbs UV light 32 transmitted through the photoresist. Because the dielectric layer 22 is transparent in the UV wavelength range, if absorbing SOG ARC layer 24 were not present, the UV light 32 would reflect off the underlying silicon layer 20 degrading a critical dimension, for example critical dimension 27 of the exposed photoresist. In this example, a positive photoresist, which provides direct image transfer, is assumed.

Figure 2E:
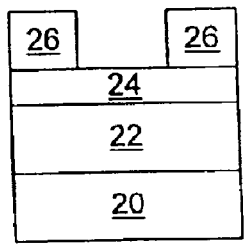

The exposed stack is developed to produce the stack of FIG. 2e. The absorbing SOG ARC layer 24 is resistant to conventional photoresist developer solutions such as a 2.5% solution of tetramethylammoniumhydroxide (TMAH). In contrast, organic ARC layers, which have some of the chemical characteristics of the photoresist materials, are more sensitive to photoresist developers. Furthermore, it is anticipated that absorbing SOG ARC layers are resistant to reducing chemistry, gas-based, photoresist stripping processes, whereas organic ARC's are not resistant. Thus, use of absorbing SOG layers may facilitate photoresist rework, without the need to reapply the ARC layer.

Figure 2F:
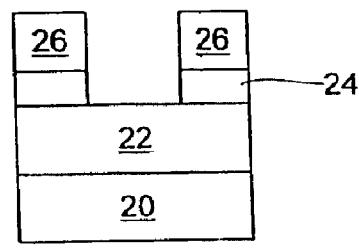

Next, a pattern is etched in the absorbing SOG ARC layer 24 through the opening in photoresist layer 26 to produce the etched stack of FIG. 2f. A fluorocarbon etch, which has a high selectivity to photoresist, is used to etch the absorbing SOG ARC layer 24. The response of the absorbing SOG to a fluorocarbon etch provides an additional advantage of the absorbing SOG over organic ARC layers, which require an oxygen plasma etch. An oxygen plasma etch can degrade the critical dimension of the developed photoresist because the photoresist, being organic based, is also etched by an oxygen plasma. A fluorocarbon plasma consumes less photoresist than an oxygen plasma. At shorter UV wavelengths, depth of focus requirements will limit the thickness of photoresist layer 26 at the exposure step shown in FIG. 2d. For example, it is estimated that at 193 nm, the thickness of photoresist layer should be approximately 300 nm. Thus, as these short wavelengths start to be employed, it will be important to have an ARC layer that can be etched selectively with respect to the photoresist.

Figure 2G:
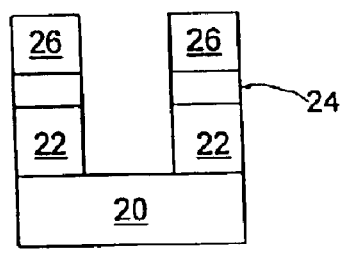
Figure 2H:
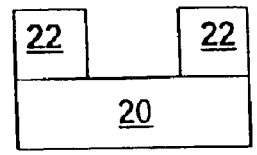

The fluorocarbon etch is continued through the dielectric layer 22 to produce the stack of FIG. 2g. Photoresist layer 26 is partially consumed during the continued etch process. Finally, the photoresist layer 26 is stripped using an oxygen plasma or a hydrogen reducing chemistry and the SOG ARC layer 24 is stripped using either a buffered oxide etch, for example a standard hydrofluoric acid/water mixture, or an aqueous or non-aqueous organoamine. Advantageously, the SOG ARC layer can be stripped with solutions that show a good selectivity with respect to the underlying dielectric layer. Thus, the general photolithographic method shown in FIGS. 2a–2h illustrate the process advantages of absorbing SOG materials as anti-reflective coating layers.

The methods of synthesizing the absorbing SOG materials as well as the synthesis of absorbing compound 10, 9-anthracene carboxy-methyl triethoxysilane, are illustrated in the following examples.

EXAMPLE 1

Synthesis of absorbing SOG containing 9-anthracene carboxy-methyl triethoxysilane In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 72 grams deionized water were combined. The flask was refluxed for 4 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268. The same spin and bake process parameters and measurement technique was used in all of the following examples.

EXAMPLE 2

Synthesis of absorbing SOG containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 25 grams 9-anthracene methanol, 10 grams 2-hydroxy-4(3-trieothoxysilypropoxy)-diphenylketone, 5 grams rosolic acid, 0.6 grams 0.1 M nitric acid and 72 grams deionized water were combined. The flask was refluxed for 4 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added. Thickness=1436 Å, n=1.479, k=0.1255

EXAMPLE 3

Synthesis of absorbing SOG containing 9-anthracene methanol, 2-hydroxy-4(3-trieothoxysilypropoxy)-diphenylketone, and rosolic acid In a 1-liter flask 297 grams 2-propanol, 148 grams acetone, 93 grams TEOS, 77 grams MTEOS, 20 grams 9-anthracene methanol, 60 grams 2-hydroxy-4(3-trieothoxysilypropoxy)-diphenylketone, 5 grams rosolic acid, 0.5599 grams 0.1 M nitric acid and 71.90 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4248 Å, n=1.525, k=0.228

EXAMPLE 4

Synthesis of absorbing SOG containing 9-anthracene methanol, 2-hydroxy-4(3-trieothoxysilypropoxy)-diphenylketone, and rosolic acid In a 1-liter flask 297 grams 2-propanol, 148 grams acetone, 108 grams TEOS, 77 grams MTEOS, 10 grams 9-anthracene methanol, 60 grams 2-hydroxy4(3-trieothoxysilypropoxy)-diphenylketone, 5 grams rosolic acid, 0.5599 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124

EXAMPLE 5

Synthesis of absorbing SOG containing 2-hydroxy-4(3-trieothoxysilypropoxy)-diphenylketone In a 1-liter flask 297 grams 2-propanol, 148 grams acetone, 123 grams TEOS, 51 grams MTEOS, 60 grams 2-hydroxy-4(3-trieothoxysilypropoxy)-diphenylketone, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3592 Å, n=1.563, k=0.067

EXAMPLE 6

Synthesis of absorbing SOG containing 9-anthracene methanol

In a 1-liter flask 297 grams 2-propanol, 148 grams acetone, 123 grams TEOS, 77 grams MTEOS, 10 grams 9-anthracene methanol, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3401 Å, n=1.433, k=0.106

EXAMPLE 7

Synthesis of absorbing SOG containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 20 grams 2-hydroxy4(3-trieothoxysilypropoxy)-diphenylketone, 25 grams of 9-anthracene methanol, and 5 grams of rosolic Acid, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3503 Å, n=1.475, k=0.193

EXAMPLE 8

Synthesis of absorbing SOG containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 5 grams 2-hydroxy-4(3-trieothoxysilypropoxy)-diphenylketone, 25 grams of 9-anthracene methanol, and 5 grams of rosolic Acid, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3119 Å, n=1.454, k=0.175

EXAMPLE 9

Synthesis of absorbing SOG containing 9-anthracene methanol, 2-hydroxy-4(3-trieothoxysilypropoxy)-diphenylketone, rosolic Acid, quinizarin, and alizarin In a 1-liter flask 297 grams 2-propanol, 148 grams acetone, 123 grams TEOS, 77 grams MTEOS, 20 grams 2-hydroxy-4(3-trieothoxysilypropoxy)-diphenylketone, 25 grams of 9-anthracene methanol, and 5 grams of rosolic acid, 2 grams of quinizarin, 2 grams alizarin, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added. Thickness=3554 Å, n=1.489, k=0.193

EXAMPLE 10

Synthesis of absorbing SOG containing 9-anthracene methanol, 2-hydroxy-4(3-trieothoxysilypropoxy)-diphenylketone, rosolic acid, and alizarin In a 1-liter flask 297 grams 2-propanol, 148 grams acetone, 123 grams TEOS, 51.5 grams MTEOS, 5 grams 2-hydroxy-4(3-trieothoxysilypropoxy)-diphenylketone, 25 grams of 9-anthracene methanol, 5 grams of rosolic acid, and 2 grams alizarin, 0.5599 grams 0.1 M nitric acid and 71.90 grams deionized water were combined. The flask was refluxed for 4 hours. To the solution, 56.68 grams of butanol, 87.99 grams 2-propanol, 44.10 grams of acetone, 59.31 grams of ethanol, 9.55 grams deionized water and 3.75 grams of 10% FC 430 (3M, Minneapolis, Minn.) were added. Thickness=3109 Å, n=1.454, k=0.193.

EXAMPLE 11

Synthesis of absorbing SOG containing 9-anthracene carboxy-methyl triethoxysilane In a 1-liter flask 297 grams 2-propanol, 148 grams acetone, 123 grams TEOS, 77 grams MTEOS, 30 grams 9-anthracene carboxy-methyl triethoxysilane, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added. Thickness=3010 Å, n=1.377, k=0.163.

EXAMPLE 12

Synthesis of absorbing SOG containing 9-anthracene methanol

In a 1-liter flask 297 grams 2-propanol, 148 grams acetone, 123 grams TEOS, 77 grams MTEOS, and 10 grams 9-anthracene methanol are combined. The solution is refluxed for 6 hours. A mixture of 0.6 grams 0.1 M nitric acid and 72 grams deionized water are added to the flask. The flask is refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) are added.

EXAMPLE 13

Synthesis of absorbing SOG containing 9-anthracene carboxy-methyl triethoxysilane In a 1-liter flask 297 grams 2-propanol, 148 grams acetone, 90 grams TMOS, 59 grams MTMOS, 60 grams 9-anthracene carboxy-methyl triethoxysilane, 0.6 grams 0.1 M nitric acid and 72 grams deionized water are combined. The flask is refluxed for 4 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

EXAMPLE 14

Synthesis of 9-anthracene carboxy-methyl triethoxysilane

In a 2 L flask, 90.0 g 9-anthracenecarboxylic acid, 86.0 ml chloromethyltriethoxysilane, 66 ml triethylamine, and 1.25 L methylisobutylketone (MIBK) that had been dried over 4 Å molecular sieves were stirred, heated slowly to reflux and refluxed for 8.5 hours. The solution was transferred to a 2L Teflon bottle and left overnight. A large quantity of solid precipitate formed. The MIBK solution was decanted and roto-evaporated to about 200 g. An equal weight of hexane was added and mixed. A precipitate formed. A 1.75 inch diameter by 2 inch high column of silica gel slurried with 20% ethylacetate/80% hexane was prepared. The MIBK/hexane solution was passed through the column under pressure and the column washed with 800 ml of 20% ethylacetate/80% hexane. The solution was filtered to 0.2 Am and roto-evaporated. When the solvent stopped coming off, the temperature was raised to 35° C. for 60 minutes. A dark amber oily liquid product was obtained (85 g).

EXAMPLE 15

Synthesis of absorbing SOG containing 9-anthracene carboxy-methyl triethoxysilane In a 1-liter flask 297 grams (4.798 moles), 2-Propanol, 148 grams (2.558 moles) acetone, 123 grams (0.593 moles) TEOS, 77 grams (0.432 moles) MTEOS, 45 grams (0.102 moles) 9-anthracene carboxy-methyl triethoxysilane, 0.6 grams 0.1 M nitric acid and 72 grams (3.716 moles) deionized water were combined. The flask was refluxed for 4 hours. To the solution, 43 grams (0.590 moles) of butanol and 1260 grams (8.344 moles) of ethyl lactate were added. Thickness=1156 Å, n=1.502, k=0.446.

EXAMPLE 16

Synthesis of absorbing SOG containing 9-anthracene carboxy-methyl triethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 30 grams (0.102 moles) 9-anthracene carboxy-methyl triethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water and 3.7 grams of 10% FC 430 were added. Thickness=1385 Å, n=1.324, k=0.533.

EXAMPLE 17

Synthesis of absorbing SOG containing 9-anthracene carboxy-methyl triethoxysilane In a 1-liter flask 297 grams (4.798 moles), 2-propanol, 148 grams (2.558 moles) acetone, 123 grams (0.593 moles) TEOS, 77 grams (0.432 moles) MTEOS, 45 grams (0.102 moles) 9-anthracene carboxy-methyl triethoxysilane, 0.6 grams 0.1 M nitric acid and 72 grams (3.716 moles) deionized water were combined. The flask was refluxed for 4 hours. To the solution, 43 grams (0.590 moles) of butanol and 981 grams (8.301 moles) of propasol-p were added. Thickness=1407 Å, n=1.334, k=0.551.

EXAMPLE 18

Synthesis of absorbing SOG containing 9-anthracene carboxy-methyl triethoxysilane A 6L jacketed reactor equipped with a nitrogen inlet, dry ice condenser and a mechanical stirrer is charged with 5000 mL hexanes 720 mL ethanol, 65 mL water and 120 g of a 10% by weight tetrabutylammonium chloride hydrate solution in water. The mixture is equilibrated for 0.5 hr with stirring at 25° C. A mixture of trichlorosilane (377.4 g, 2.78 Mol), methyltrichlorosilane (277.7 g, 1.86 Mol), and (203.8 g, 0.46 Mol) 9-anthracene carboxy-methyl triethoxysilane is added to the reactor using a peristaltic pump over a period of 70 minutes. Upon completion of the silane and absorbing compound addition, hexane is pumped through the lines for 10 minutes. The reaction is stirred for 2.3 hours, the ethanol/$H_2O$ layer is removed and then the remaining hexane solution filtered through a 3 micron ($\mu$m) filter, followed by a 1 $\mu$m filter. To the solution, (3957 g, 45.92 Mol) hexane is added.

EXAMPLE 19

Synthesis of absorbing SOG containing 9-anthracene carboxy-methyl triethoxysilane In a 5 L flask, 508.8 grams (3.10 Mol) of triethoxysilane (HTEOS), 135.8 g (0.3 Mol) 9-anthracene carboxy-methyl triethoxysilane, and 508.8 g (8.77 Mol) of acetone are mixed by magnetic stirring and cooled to below 20° C. A mixture of 508.8 g (8.77 Mol) of acetone, 46.69 g (2.59 Mol $H_2O$, 0.0009 Mol $HNO_3$) of 0.02N nitric acid, and 37.03 g (2.06 Mol) of deionized water are added slowly through a dropping funnel to the mixture in the 5 L flask over a 45 minute period, maintaining the temperature below 20° C. The solution is refluxed for 8 hours. To the solution, 4631 g (30.67 Mol) ethyl lactate is added.

EXAMPLE 20

Synthesis of absorbing SOG containing phenyltriethoxysilane

In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1727 Å, n=1.957, k=0.384.

EXAMPLE 21

Synthesis of absorbing SOG containing phenyltriethoxysilane

In a 1-liter flask 297 grams (4.798 moles) 2-propanol, 148 grams (2.558 moles) acetone, 93 grams (0.448 moles) TEOS, 37 grams (0.209 moles) MTEOS, 100 grams (0.418 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1325 Å, n=1.923, k=0.364.

EXAMPLE 22

Synthesis of absorbing SOG containing phenyltriethoxysilane

In a 1-liter flask 297 grams (4.798 moles) 2-propanol, 148 grams (2.558 moles) acetone, 119 grams (0.573 moles) TEOS, 27 grams (0.153 moles) MTEOS 74 grams (0.306 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1286 Å, n=1.889, k=0.286.

EXAMPLE 23

Synthesis of absorbing SOG containing phenyltriethoxysilane

In a 1-liter flask 297 grams (4.798 moles) 2-propanol, 148 grams (2.558 moles) acetone, 73 grams (0.351 moles) TEOS, 45 grams (0.251 moles) MTEOS 121 grams (0.503 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1047 Å, n=1.993, k=0.378.

EXAMPLE 24

Synthesis of absorbing SOG containing phenyltriethoxysilane and 2-hydroxy-4(3-trieothoxysilypropoxy)-diphenylketone In a 1-liter flask 297 grams (4.798 moles) 2-propanol, 148 grams (2.558 moles) acetone, 73 grams (0.351 moles) TEOS, 45 grams (0.251 moles) MTEOS, 103 grams (0.428 moles) phenyltriethoxysilane, 12 grams (0.0298 moles) 2-hydroxy-4(3-trieothoxysilypropoxy)-diphenylketone, 0.6 grams 0.1 M nitric acid and 72 grams (3.716 moles) deionized water were combined. The flask was refluxed for 4 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added. Thickness=1514 Å, n=1.969, k=0.325.

Although the invention has been described with reference to particular examples, the description is only an example of the invention's application and should not be taken as a limitation. Various adaptations and combinations of features of the examples disclosed are within the scope of the invention as defined by the following claims.

We claim:

1. A photolithographic material comprising a siloxane polymer and an incorporatable organic absorbing compound that absorbs light at wavelengths less than 375 nm and that comprises a chromophore and a reactive group, wherein the absorbing compound comprises at least one amine group, at least one carboxylic acid group, at least one branched alcohol group or at least one ketone group, wherein the siloxane polymer comprises hydrogensiloxane, hydrogensilsesquioxane, organohydridosiloxane, organhydridosilsesquioxane polymers; copolymers of hydrogensilsesquioxane and an alkoxyhydridosiloxane or hydroxyhydridosiloxane, devirivates of sililic acid or combinations thereof, and wherein the photolithographic material can be sacrificially stripped using a buffered oxide etch, an aqueous organoamine, or a non-aqueous organoamine.

2. The material of claim 1, wherein the range is at wavelengths less than about 260 nm.

3. The material of claim 1, wherein the organic absorbing compound comprises from one to three benzene rings and wherein the reactive group includes hydroxyl groups, amine groups, carboxylic acid groups, or substituted silyl groups with silicon bonded to at least one substituent selected from the group consisting of halogen atoms.

4. The material of claim 3, wherein the benzene rings are fused.

5. The material of claim 1, wherein the organic absorbing compound further comprises an alkoxy group, an acetoxy group, a ketone group or an azo group.

6. The material of claim 5, wherein the organic absorbing compound comprises siliconacetoxy, silicondiacetoxy, silicontriacetoxy, or chlorosilyl.

7. The material of claim 1, wherein the siloxane polymer comprises methylsiloxane, methylsilsesquioxane, phenylsiloxane, phenylsilsesquioxane, methylphenylsiloxane, methylphenylsilsesquioxane, silicate polymers, derivatives of sililic acid or mixtures thereof.

8. The material of claim 1, wherein the siloxane polymer is of a general formula selected from the group comprising $(H_{0-1.0}SiO_{1.5-2.0})_x$, where x is greater than about 8, and $(H_{0-1.0}SiO_{1.5-2.0})_n(R_{0-1.0}SiO_{1.5-2.0})_m$, where x is greater than 0, the sum of n and m is from about 8 to about 5000 and R is a $C_1$–$C_{20}$ alkyl group or a $C_6$–$C_{12}$ aryl group.

9. A coating solution comprising the absorbing spin-on-glass material of claim 1 and a solvent or a solvent mixture.

10. The coating solution of claim 9, wherein the solution is between about 0.5% and about 20% by weight absorbing spin-on-glass material.

11. The coating solution of claim 9, wherein the solvent includes ethyl lactate or propylene glycol propyl ether or propylene glycol methyl ethyl acetate (PGMEA).

12. A sacrificial film comprising the coating solution of claim 9.

13. The material of claim 1, wherein the organic absorbing compound comprises anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-methyl triethoxysilane, 4-phenylazophenol, 4-ethoxyphenylazobenzene-4-carboxy-methyl triethoxysilane, 4-methoxyphenylazobenzene-4-carboxy-methyl triethoxysilane, phenyltriacetoxysilane, phenylmethyldiacetoxysilane, diphenyldiacetoxysilane, or mixtures thereof.

14. A coating solution comprising the absorbing spin-on-glass material of claim 13 and a solvent or a solvent mixture.

15. A sacrificial film comprising the coating solution of claim 14.

* * * * *